United States Patent [19]

Kuster

[11] Patent Number: 4,505,375
[45] Date of Patent: Mar. 19, 1985

[54] APPARATUS FOR CONVEYING FLAT GOODS ONE SIDE OF WHICH BEARS A LIQUID LAYER

[75] Inventor: Kaspar Kuster, Allschwil, Switzerland

[73] Assignee: Ciba-Geigy Corporation, Ardsley, N.Y.

[21] Appl. No.: 397,372

[22] Filed: Jul. 12, 1982

[30] Foreign Application Priority Data

Jul. 20, 1981 [CH] Switzerland .................. 4746/81

[51] Int. Cl.³ ............................................. B65G 37/00
[52] U.S. Cl. ..................................... 198/482; 198/488
[58] Field of Search ............... 198/482, 801, 488, 478; 414/78; 34/149, 150, 151, 162, 163, 189

[56] References Cited

U.S. PATENT DOCUMENTS

| 1,135,316 | 4/1915  | Olson      | 198/801 |
| 1,736,866 | 11/1929 | Wagner et al. | 198/482 |
| 2,874,650 | 2/1959  | Royer      | 198/488 |
| 3,037,608 | 6/1962  | Rothschild | 198/488 |
| 3,184,032 | 5/1965  | Jonsson    | 198/801 |
| 3,202,115 | 8/1965  | Jones, Jr. | 198/482 |
| 3,378,131 | 4/1968  | Weber      | 198/482 |
| 3,593,862 | 7/1971  | Pierson    | 198/801 |
| 3,700,121 | 10/1972 | McManus    | 414/331 |
| 4,058,908 | 11/1977 | Weber      | 198/478 |
| 4,196,802 | 4/1980  | Lorentzen  | 198/482 |

FOREIGN PATENT DOCUMENTS

| 12442   | 6/1980 | European Pat. Off. ......... 198/488 |
| 2245280 | 4/1974 | Fed. Rep. of Germany ...... 34/149 |
| 1270273 | 7/1961 | France .................... 198/801 |
| 127548  | 2/1950 | Sweden .................... 414/78 |
| 1420547 | 1/1976 | United Kingdom ........... 198/482 |

Primary Examiner—Joseph E. Valenza
Assistant Examiner—Daniel R. Alexander
Attorney, Agent, or Firm—Harry Falber

[57] ABSTRACT

An apparatus for conveying flat goods having one face covered with a liquid layer comprises two roller trains for, respectively, delivering the goods to and removing the goods from, a generally vertically orbiting chain having a first group of fork-shaped carriers attached thereto, and at least one generally horizontally conveyed, parallelogram-guided, fork-shaped carrier. The rollers of the roller trains are supported each only at one of its roller ends. The carriers of the first group have prongs which pass through gaps between adjacent rollers of the roller trains. Likewise, the prongs of one of the two carrier systems (the first group and the horizontally conveyed carrier or carriers) pass through gaps between adjacent prongs of the other system. The two carrier systems are driven from a common motor (variable drive). The arrangement and kinematics is such that the horizontally conveyed fork overtakes each fork of the first group shortly before and after the latter carrier passes through an upper direction-reversing, preferably arcuate stretch.

5 Claims, 4 Drawing Figures

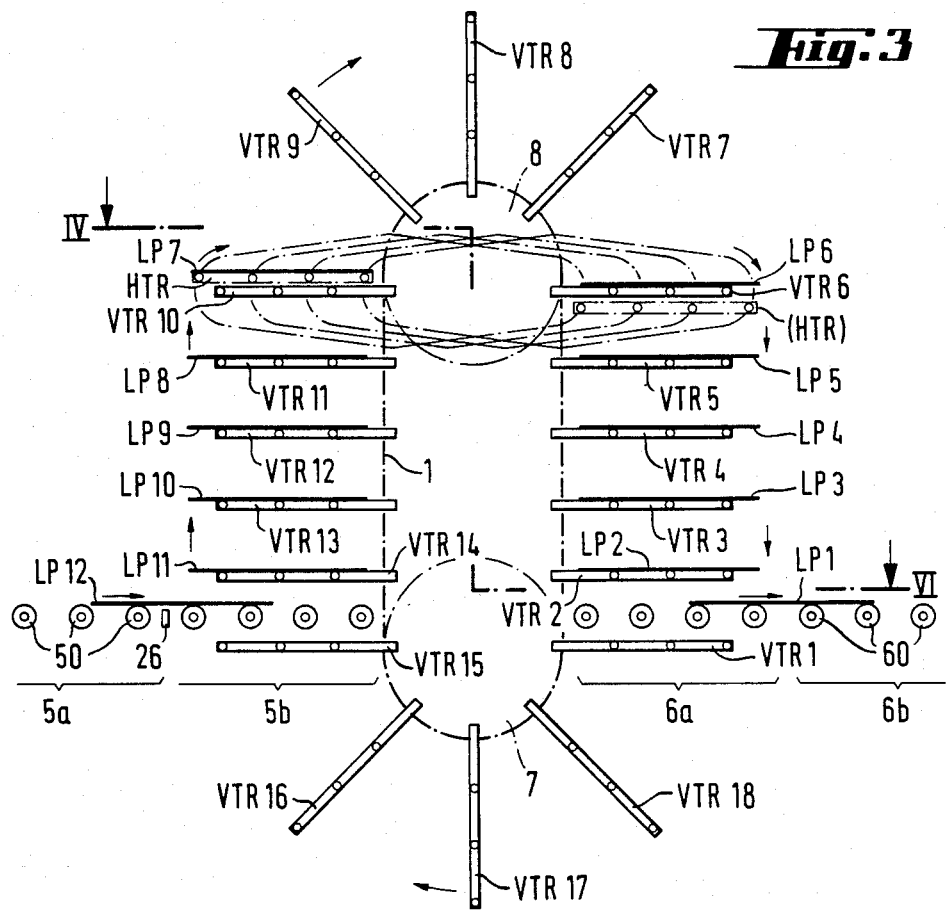
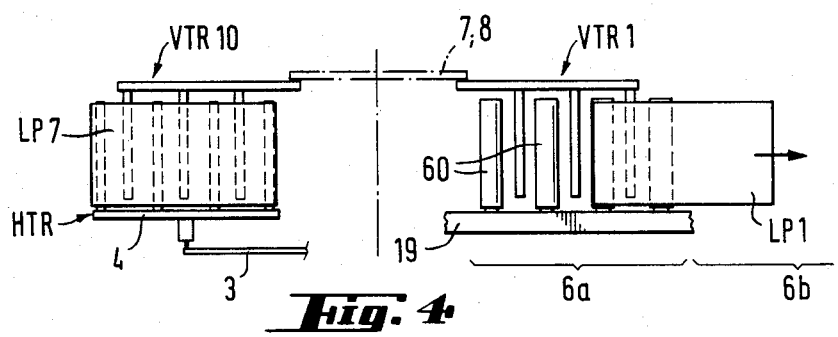

APPARATUS FOR CONVEYING FLAT GOODS ONE SIDE OF WHICH BEARS A LIQUID LAYER

BACKGROUND OF THE INVENTION

This invention relates to an apparatus for conveying flat goods such as plates, sheets, films and the like, bearing on one side thereof a liquid layer, which apparatus comprises conveyor means moving along an ascending and a descending conveying stretch as well as a transverse, substantially horizontal connecting stretch therebetween, and carrier means for the goods to be conveyed and connected with the conveyor means; the said carrier means holding the goods always in horizontal position while conveying them along the aforesaid stretches.

Such apparatus are used as drying apparatus arranged vertically at several super-imposed levels or similar installations, which increasingly replace the tunnel dryers to economize factory space. When drying still liquid layers, and especially those of low viscosity, it is especially important that these layers are always kept in strictly horizontal position over the entire length of the transportation route, and that they are not exposed to any abrupt changes of velocity or sudden vibrations, as, otherwise, the still liquid mass of the layer can flow off or, at least, the uniformity of the layer can be impaired.

When manufacturing solder-stopping masks on conductor plates (printed circuit boards) a photosensitive lacquer is applied to one face of the plates and is then illuminated and developed (see, for instance, European Patent No. 0002040). In doing so, it is very important that the lacquer coating is as thin as possible and absolutely uniform. Therefore, particular care is also required when converting the liquid layer to a solid coating. This is achieved in the safest manner by leaving the freshly applied layers on the conductor plates exposed to air and completely undisturbed for a certain period of time, e.g., for about 5 to 15 minutes ("pre-airing"). During this time, a portion of the solvent such will evaporate from the lacquer layer that the lacquer will have become sufficiently solid to permit subsequent finishing drying by exposure to stronger air currents in a stove.

In a continuous process such "pre-airing" should, of course, also be carried out continuously. As the "pre-airing" phase of lacquer layers can be relatively long, a vertically arranged pre-airing arrangement is preferred in order to save floor space. For attaining a fully continuous plant operation, the pre-airing station should be equipped with a conveyor apparatus of the initially described type.

The known conveyor apparatus of this type could not fully satisfy the demands made on the qualities of transportation, i.e. absolutely horizontal position and freedom from shock and vibrations; and either their construction or their mechanics are too complicated, cumbersome and/or expensive.

In a known hot air stove for drying printed sheets or the like, marketed by The Argon Service Ltd., Milan, Italy, a solution of the problem of a combined vertical-and-horizontal conveying operation with constant holding of the sheets in horizontal position is attempted by conveying them through two lifts running in opposite directions and by a large number of transfer frames. The lifts comprise each two pairs of endless cycling chains, placed opposite one another, and supporting strips. The transfer frames can be inserted in the lifts and are carried by their supporting strips. In the upper lift region, the transfer frames are pushed by means of a further chain conveyor from the ascending to the descending lift. Loading of the transfer frames takes place by means of a conveyor belt on the feeding side which pushes the printed sheets to be dried onto the next-ascending transfer frame. In order to discharge the sheets, the sheets are withdrawn from the transfer frames when the latter are pushed back in the lower region onto the ascending lift. The dried sheets then drop onto a second conveyor belt for their further transportation.

The above-described known arrangement is mechanically rather involved and can nevertheless not fully satisfy the stiff demands as to uniformity of conveyance such as is required, for instance, in the case of printed circuits, as explained hereinbefore. In particular, the loading and unloading of the transfer frames and their transfer in the upper conveyor region would hardly leave sensitive liquid layers undamaged.

Other apparatus are known, for instance, from the U.S. Pat. Nos. 1,736,866, 3,378,131 and 4,058,908, in which the carriers for the goods to be transported are constituted by rods or bars fastened to conveyor chains to form a kind of grid. The horizontal conveyance from the ascending to the descending conveyor limb is carried out by pushing organs which seize the plate-shaped goods to be conveyed at their margins and push them from the uppermost stage of the ascending limb to the uppermost stage of the descending limb. However, this kind of horizontal transfer is also much too rough for many practical applications, in particular for conveying liquid-covered conductor plates (e.g. printed circuit boards) and suffers, moreover, from the drawback that the plates may be damaged at their margins, where they were seized by the pushing organs, and on their underside, by being pushed over the rods of the afore-mentioned grids.

OBJECTS AND SUMMARY OF THE INVENTION

It is therefore a primary object of the invention to provide an apparatus of the initially described type which is free from the drawbacks discussed in hereinbefore, which is constituted by simple mechanical means and guarantees a horizontal and vertical conveyance of flat goods practically free from jolts, shocks and vibrations, while maintaining the goods in horizontal position throughout their entire transportation in the apparatus.

It has been found that these objects will be attained, in accordance with the present invention, in an apparatus of the initially described type in which the conveyor means comprise:

(a) a single endless first chain composed of links and joints and adapted for orbiting in a plate via the initially mentioned, preferably rectilinear ascending and descending stretches; from the former to the latter through an upper direction-reversing, preferably arcuate stretch; and from the latter to the former preferably rectilinear stretch through a lower direction-reversing, preferably also arcuate stretch, and (b) transverse (i.e. preponderantly horizontally) conveying means, orbiting to cover the initially mentioned substantially horizontal stretch; and a first group of the carrier means consist of fork-shaped carriers comprising each a carrier bar and a number of prongs mounted on the said carrier bar and protruding at an angle from the latter, each carrier bar being attached in such a manner to a corresponding link of the first chain, outwardly of, and parallel with, the plane in which the said first chain runs, that the fork-shaped carrier remains in horizontal position while being transported by the first chain along the said ascending and descending stretches; while the said carrier means further comprise at least one transversely conveyed fork-shaped carrier of similar construction as the carriers of the said first group, the carrier bar of each such transversely conveyed carrier being engaged by the above-mentioned transverse conveying means for movement therewith, and parallelogram-guiding means associated with the transverse conveying means and the at least one transversely conveyed carrier for guiding the latter carrier in an elliptic movement, while maintaining this last-mentioned carrier at all times in a horizontal position;

the said transversely conveyed carrier being so arranged with regard to the carriers of the said first group, as well as the kinematics of the said at least one transversely conveyed carrier and all carriers of the said first group being so adjusted with respect to each other, that the prongs of the carriers of the first group, on the one hand, and the prongs of the said at least one transversely conveyed carrier are staggered relative to each other, whereby the prongs of one of these systems pass through the gaps between adjacent prongs of the other system; and that the said at least one transversely conveyed carrier overtakes an ascending one of the carriers of the first group immediately before, and overtakes a descending one of the last-mentioned carriers immediately after, such carrier of the first group enters or leaves, respectively, the said upper direction-reversing stretch, whereby plane goods resting on the ascending carrier are lifted off the latter by the upwardly overtaking transversely conveyed carrier, and whereby the same goods are re-deposited by the transversely conveyed carrier on to a descending carrier, of the first group, being overtaken in downward direction.

In preferred embodiments at least one of the following features affords most satisfactory performance: The carrier arm of a carrier of the first group is preferably rigidly fastened to the center of a link of the said first chain. The said conveyor means preferably comprise chain guiding means which extends at least over that stretch of the chain orbit in which the goods can be loaded on to the ascending carriers of the first group.

In an especially preferred embodiment the apparatus further comprises a first roller train located on the side of the said ascending stretch of the first chain for feeding the goods to the ascending carriers, and a second roller train located on the side of the said descending stretch of the first chain for removing the goods from the descending carriers, both these roller trains comprising rollers so mounted therein and at such distance from one another that the prongs of the carriers of the first group can pass through the gaps between adjacent rollers of the roller trains.

In a most preferred embodiment the transverse conveying means preferably comprise a second chain composed of links and joints and orbiting in a plane; the carrier bar of the said transversely conveyed carrier comprises a carrier shaft being pivotally mounted on one of the said links of the second chain and having a free shaft end on which the carrier bar of the transversely conveyed carrier is fixedly mounted to extend outside and parallel with the plane in which the said second chain orbits, and wherein the parallelogram-guiding means hingedly engage the aforesaid carrier shaft.

DETAILED DESCRIPTION OF THE EMBODIMENT SHOWN IN THE DRAWINGS

Figure 1:
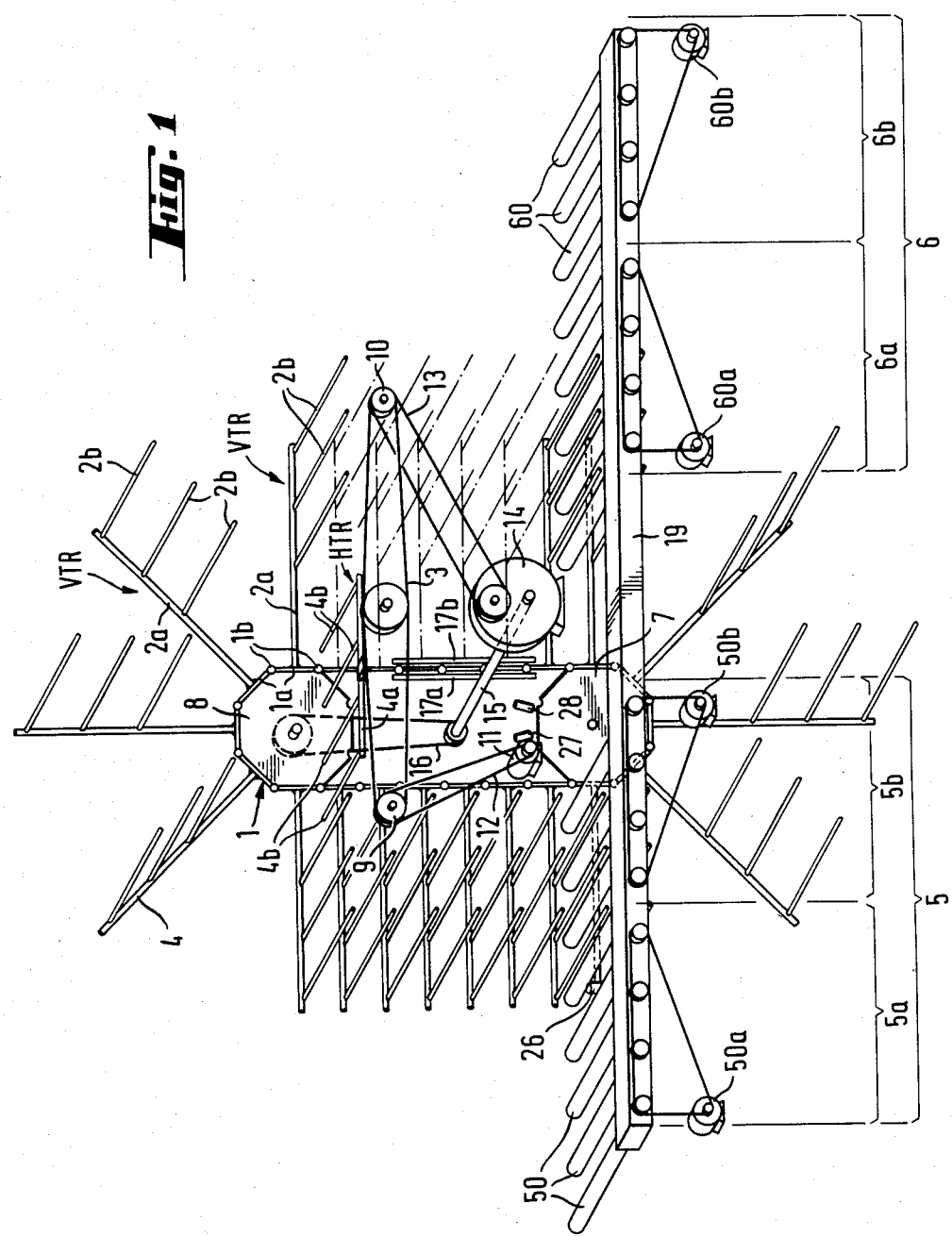
Figure 2:
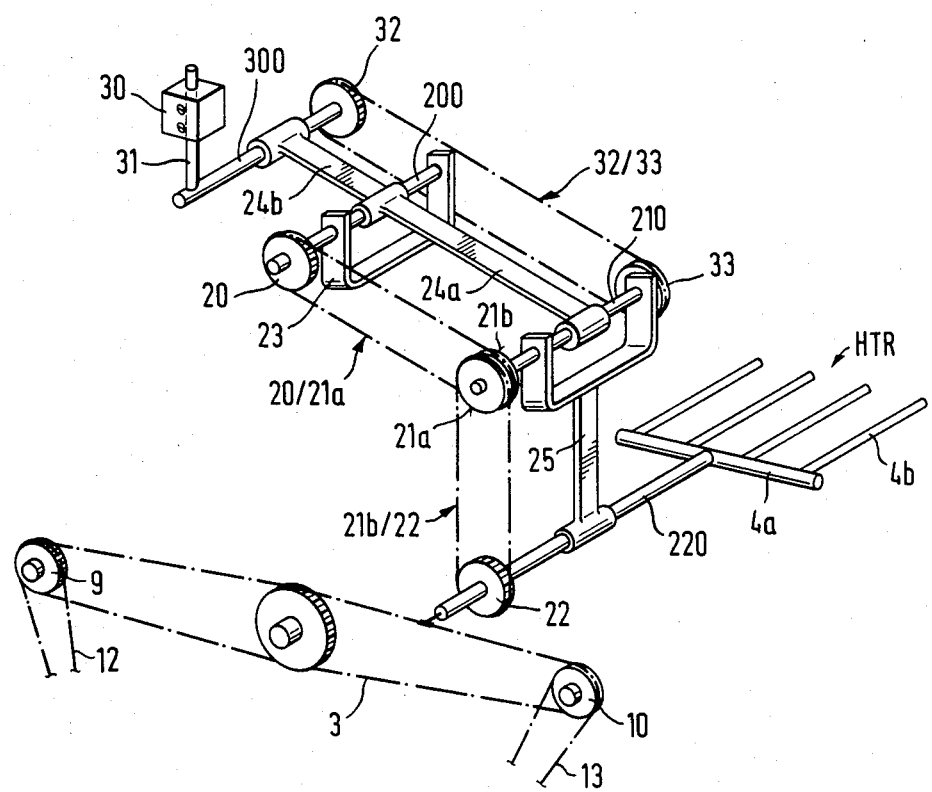

Further objects and details of the invention will become apparent from the following description thereof with reference to the accompanying drawings in which FIG. 1 shows a simplified schematic front view representation of the apparatus for processing liquid-coated sheet material, according to the invention, FIG. 2 shows, in perspective, the parallelogram-guiding mechanism for the horizontally conveying fork, FIG. 3 shows a further simplified schematic front view of the central section of the apparatus shown in FIG. 1, serving to illustrate the operational phases thereof in greater detail, and FIG. 4 a top view taken from two different planes as indicated by the arrows IV in FIG. 3.

The apparatus shown in FIG. 1 comprises a generally vertically disposed endless conveyor chain 1 having a substantially vertically disposed ascending and an equally substantially vertically disposed descending stretch or limb as well as two arcuate portions which are guided and moved with the aid of a pair of chain-guiding sprocket wheels 7 and 8 engaging the lower and the upper arcuate portions, respectively, of the conveyor chain 1. The conveyor chain 1 is equipped with vertically conveying carrier elements, preferably in the shape of forks VTR, adapted for lifting or lowering the sheets to be conveyed; the apparatus further comprises a second, substantially horizontally extending endless conveyor chain 3 carrying at least one horizontal carrier fork HTR. Preferably a single horizontal carrier fork HTR is provided. Advantageously, the apparatus shown in FIG. 1 is interposed between two preferably horizontally disposed trains of rollers 5 and 6 of which the roller train 5, for instance, feeds the sheets to be dried to the drying apparatus according to the invention, and the roller train 6 takes up the dried sheets from the said drying apparatus and conveys them to other handling stations.

The drive of the sprocket wheels 7 and 8, as well as 9 and 10 is effected by means of a variable drive 11, conventionally an electric motor having an infinitely variable speed transmission. This drive 11 drives, via a flat belt 12, the sprocket wheel 9, and together therewith the horizontal conveyor chain 3. The second chain-guiding sprocket wheel 10 of the horizontal conveyor chain 3 drives a gear unit 14, of fixed transmission, by means of a chain drive 13; and, via the gear unit, a shaft 15 and a further chain drive 16, it also drives the upper guiding sprocket wheel 8 of the vertically disposed conveyor chain 1.

Within the roller trains 5 and 6, the rollers 50 and 60 are, respectively, arranged in two groups 5a and 5b, and 6a and 6b, each of which groups can be driven by a separate motor 50a, 50b, 60a and 60b, respectively.

Each of the vertically conveying forks VTR consists of a carrier bar 2a extending parallel to the roller trains 5 and 6 to one side thereof, and each carrier bar 2a bears a plurality of prongs 2b protruding at right angles from their respective bar 2a and extending transversely to the longitudinal axis of the roller trains 5 and 6. The carrier bars 2a are fastened, on their sides turned toward the outside, i.e. away from the roller trains 5 and 6, or the space above the latter, each exactly to the center of a chain link 1a of the vertically conveying chain 1, outwardly of, and parallel with the plane in which the chain 1 runs, so that the prongs 2b of each of the forks VTR are exactly parallel with the shafts of the sprocket wheels 7 and 8.

The mounting of the vertically conveying forks VTR at the exact centers of the links 1a of the vertically conveying chain 1 offers the advantage that the forces (torques) in the joints 1b between the links 1a of the chain 1 mutually balance one other, if all forks VTR carry the same load and the centers of gravity of these loads are all at the same distance from the chain. If this is the case only, the mere forces of pull will act on the joints 1b. These ideal conditions are, however, not always fully met during operation. In order to compensate for irregularities occurring during operation, the vertically conveying chain 1 moves through its two vertical stretches in lateral guide means 17a and 17b, of which only those guiding the descending chain stretch (on the right hand side) are shown in FIG. 1, for the sake of clarity.

The horizontally conveying fork HTR also consists of a carrier bar 4a bearing prongs 4b extending normal to the bar, and is connected with the horizontally conveying chain 3 and with a parallelogram-guiding mechanism in a manner which will be explained further below, and whereby the fork HTR remains in horizontal position throughout its entire orbited path, with its prongs 4b always in positions exactly parallel with the prongs 2b of the vertically conveying fork VTR. This mutual disposition and the orbital movements of the vertically conveying forks VTR and the horizontally conveying fork HTR are coordinated in such a manner that the prongs 2b and 4b of these fork systems pass each other, the prongs of one fork through the gaps between the prongs of the other fork. Furthermore, the gear ratio of the gear unit 14 is so chosen or adjusted that each vertically conveying fork VTR is overtaken by the horizontally conveying fork HTR shortly before and shortly after its upper arcuate move, caused by the sprocket wheel 8. In the illustrated embodiment, the horizontally conveying fork HTR overtakes, during each of its cycles, exactly four vertically conveying forks VTR. This arrangement could also comprise more than one horizontally conveying fork HTR, which would then be moved more slowly, depending on the number of forks HTR present.

The parallelogram-guiding mechanism for the horizontally conveying fork HTR is illustrated in FIG. 2 and comprises four sprocket wheels 20, 21a, 21b and 22 which are fixedly mounted on their shafts 200, 210 and 220 for rotation therewith. The sprockets 21a and 21b are mounted on one and the same shaft 210 and could be devised as a double gear. The sprockets 20 and 21a and the sprockets 21b and 22 are connected with each other, respectively, by means of chains 20/21 and 21/22 and thus constitute the actual parallelogram-guiding means. The shaft 200 is rotatably supported in a bearing block 23 being secured against rotation in a machine frame (not shown), and further bears a two-armed rocking lever 24a/24b. The lever arm 24a (illustrated on the right in FIG. 2) is articulatedly connected at its free end with the shaft 210 bearing the two centrally located parallelogram-guiding sprockets 21a and 21b, there being also fixedly mounted on shaft 210 a further lever 25 the free end of which is hingedly connected with the shaft 220 of the parallelogram-guiding sprocket 22. The shaft 220 bears at its one end the horizontally conveying fork HTR and is coupled at its other end with a link of the driving chain 3 for this fork, by means of a pivotable connection. Thereby the shaft 220 is moved along with the chain 3, while being turned about its own axis, owing to the parallelogram guidance, constituted by the sprockets 20, 21a/21b and 22 and by the chains 20/21a and 21a/22, while the fork HTR always retains its horizontal position.

A counterweight 30 is provided to relieve the load on the entraining connection between the shaft 220 and the horizontal conveyor chain 3. The counterweight 30 is mounted, preferably displaceably so that it can be set in random positions, on a rod 31 which is rigidly connected at its one end, and preferably at right angle, with a shaft 320 which latter is hingedly connected with the free end of the lever arm 24b. At its end protruding from the hinge connection with this lever arm on the side opposite to that which bears the counterweight 30, the shaft 300 is fixedly attached to a sprocket wheel 32, for rotation therewith. This sprocket wheel 32 is connected by means of a chain 32/33 with a second sprocket wheel 33 which is in turn fixedly mounted on the shaft 210 for rotation with the latter. Due to this arrangement, the orbital movement of the chain 3 causes the shaft 300 and, together therewith, the counterweight 30 attached to the rod 31 to turn in such a way that the load is balanced at each point of the orbit of chain 3.

All rollers 50 and 60 and the forks VTR and HTR, which come into contact with the conveyed goods, are covered with a coating or hose of silicon caoutchouc having preferably a wall thickness of about 1 to 2 millimeters. Products designated as SR50 and sold by the Swiss company of Posa, and Baysilon, sold by Bayer AG, Leverkusen, Germany have been found to be particularly advantageous as hose material. These solvent-resistant silicon rubbers possess good vibration damping properties, protect the conveyed goods (sheets or plates) against scratching, and afford a satisfactory adhesion between the rollers or forks, respectively, on the one hand, and the conveyed goods, on the other hand.

The rollers 50 and 60, respectively, of the roller trains 5 and 6 are supported on one side on a horizontally extending roller carrier 19, with the free ends of all of these rollers protruding into gaps between the prongs 2a of the vertically conveying forks VTR.

The drive control is carried out by means of approximation or capacitance switches 26, 27 and 28. The approximation switch 26 is arranged between the two groups of rollers 5a and 5b of the roller train 5 which conveys the goods to feed them to the drying apparatus, while the approximation switches 27 and 28 are located close to the circumference of the lower sprocket wheel 7, arcuately deflecting vertically conveying chain 1 and being of octagonal configuration, as shown in FIG. 1, or of a similar suitable polygonal shape. The approximation switch 26 responds to a sheet or plate, being conveyed by the roller group 5a driven from the motor 50a, as the forward edge of the sheet enters the effective range of the switch 26. The approximation switches 27 and 28 respond as a corner of the polygonal, arcuately deflecting sprocket wheel 7 enters their effective ranges. The successive passage of the corners of the sprocket wheel 7 past the approximation switches 27 and 28 corresponds exactly to the mutual distance between the vertically transporting forks VTR of the vertical conveyor chain 1. This arrangement is such that the switch 27 will respond whenever one of the forks VTR has just left the level of the roller train 5, and the switch 28 will respond whenever one of the forks VTR has descended to and entered the level of the roller train 6.

The approximation switches 26, 27 and 28 control the entire operation with the aid of an electronic control circuit (not shown), as shall be explained hereinafter in detail when describing the functioning of the apparatus according to the invention.

The entire conveyor installation is placed in operation by switching on the variable drive 11. Coated conductor plates LP1 to LP12 etc. (FIG. 3) are pushed, with their coated faces uppermost, by a feeding unit (not shown) on to the conveying rollers 50 of the roller group 5a of the train of rollers 5. The roller group 5a, driven by the motor 50a, is moved at this time, at uniformly slow speed. The roller group 5a stops its advance movement as soon as the conductor plate LP activates the approximation switch 26. When the approximation switch 27 (FIG. 1) is activated, the motors 50a and 50b are accelerated, and likewise are the roller groups 5a and 5b to attain the plate entry speed. The duration of maintaining the full entry speed is determined by an adjustable timer. After the set time has elapsed the motor 50b, and together therewith the roller group 5b, are stopped. Simultaneously, the motor 50a is re-started and drives the roller group 5a anew with the above-mentioned uniform slow speed until the next conductor plate 13 (not shown) arrives in the operative range of the approximation switch, whereupon the abovedescribed operation is repeated. The fed-in conductor plate LP12 which is arrested on the roller group 5b, is then lifted off this roller group by the next-following fork VTR 15 and is conveyed upwardly at a constant speed.

Before the ascending conductor plates LP have reached the point where the forks VTR carrying them begin the arcuate portion of their travel with its 180° turn toward the descending stretch, the forks VTR are overtaken by the horizontally conveying fork HTR approaching them from below. In doing so, the latter fork HTR lifts the conductor plate LP off the vertically ascending fork VTR on which it has been resting. This phase is illustrated in FIG. 3 in the case of the conductor plate LP7 which has just been lifted off the vertically conveying fork VTR10 and is now resting on the horizontally conveying fork HTR. The parallelogram-guided fork HTR then overtakes all the forks present in the upper arcuate portion of the travel path of vertical conveyor chain 1, namely the forks VTR9, VTR8, and last of all, VTR7 which has, at this time, already left the arcuate portion of its travel and has entered the vertically descending stretch thereof. When overtaking the vertically descending fork VTR7, the horizontally conveying fork HTR therefore deposits the conductor plate LP which it has been carrying, on to the said descending fork VTR7.

In the right-hand half of FIG. 3 what is actually illustrated is the final phase of the preceding horizontal conveying operation, in which the fork HTR (shown in dashed lines), after previously lifting the conductor plate LP6 off the vertically ascending fork VTR9, has just deposited this plate LP6 on the vertically descending fork VTR6. The ratio of the speed of the vertically conveying forks VTR to that of the horizontally conveying fork HTR is so adjusted by means of the gear train 14 that, in the interval of time in which the vertically conveying forks travel a length corresponding to the distance between them, the horizontally conveying fork HTR travels exactly half of its entire orbit. Use of a second horizontally conveying fork HTR permits halving of the rotational speed of the latter.

The conductor plates LP which are conveyed downwardly by the descending forks VTR are deposited on the roller group 6a of the roller train 6, which group is stationary at that time. By means of the approximation switch 28 (FIG. 1), the motors 60a and 60b of the two roller groups 6a and 6b, respectively, are then energized to attain the full speed at which the dried goods are discharged from the drying apparatus. The discharge time is determined with the aid of an adjustable timer. After the set time interval has lapsed, the motor 60a and together therewith the roller group 6a are stopped, and the speed of the motor 60b, and together therewith the roller group 6b, are slowed down to a previously set reduced speed. The conductor plate LP1 is then transferred by the roller group 6b to the next processing station.

At the moment in time illustrated in FIG. 3, the rollers 60 carry away toward the right the conductor plate LP1 which had just been deposited on these rollers by the vertically descending conveyor fork VTR1. There is already approaching from above the next-following vertically descending fork VTR2 ready to deposit its plate LP2 on the rollers 60. The work phase is subsequently periodically repeated by all vertically conveying forks VTR3 to VTR18 in the further work cycles of the chain 1, while the roller train 6 is controlled by the approximation switch 28 (FIG. 1) in the manner described hereinbefore.

The illustrated conveyor apparatus is destined in particular for being built into drying chambers of the tower type. The two trains of rollers 5 and 6 then constitute the entry and outlet means for this chamber.

What is claimed is:

1. An apparatus for conveying flat goods such as plates, sheets, films and the like one side of which goods bears a liquid layer to be solidified, said apparatus comprising conveyor means movable along an ascending and a descending stretch as well as along a substantially horizontal stretch therebetween, and carrier means connected to said conveyor means and being adapted for carrying said goods always in horizontal position while conveying them along said stretches;

wherein said conveyor means comprises a single endless first chain composed of links and joints and adapted for moving in a plane along said ascending and descending stretches and along an upper and a lower direction-reversing stretch, from one of the two former stretches to the other, respectively; and transverse conveying means for traveling over said substantially horizontal stretch;

and wherein a first group of said carrier means consist of fork-shaped carriers comprising each a carrier bar and a number of prongs mounted on said carrier bar and protruding at a right angle from the latter, each of said carrier bars being attached in such a manner to a link of said first chain, outwardly of, and parallel with, the plane in which said first chain runs, that the fork-shaped carrier remains in horizontal position while being transported by said first chain along said ascending and descending stretches; and said carrier means further comprise at least one transversely conveyed fork-shaped carrier of similar construction as the carriers of said first group, the carrier bar of each such transversely conveyed carrier being engaged by said transverse conveying means for movement therewith, and parallelogram-guiding means associated with said transverse conveying means and said at least one transversely conveyed carrier for guiding the latter carrier in an elliptic movement, thereby maintaining the same at all times in horizontal position;

said transversely conveyed carrier being so arranged with regard to said carriers of said first group, as well as the kinematics of said at least one transversely conveyed carrier and all carriers of said first group being so adjusted with respect to each other, that the prongs of the carriers of said first group, on the one hand, and the prongs of said at least one transversely conveyed carrier are staggered relative to each other, and that said at least one transversely conveyed carrier overtakes an ascending one of said carriers of said first group immediately before, and overtakes a descending one of these last-mentioned carriers immediately after, such carrier of said first group enters or leaves, respectively, said upper direction-reversing stretch, whereby flat goods resting on said ascending carrier are lifted off the latter by the upwardly overtaking transversely conveyed carrier, and whereby the same goods are re-deposited by said transversely conveyed carrier on to said descending carrier, of said first group, being overtaken in a downward direction.

2. The apparatus of claim 1, wherein the carrier arm of a carrier of said first group is rigidly fastened to the center of a link of said first chain.

3. The apparatus of claim 1, wherein said conveyor means comprise chain guiding means which extends at least over that stretch of the chain orbit in which said goods can be loaded on to said ascending carriers of the first group.

4. The apparatus of claim 1, further comprising a first roller train located on the side of said ascending stretch of said first chain for feeding said goods to said ascending carriers, and a second roller train located on the side of said descending stretch of said first chain for removing said goods from said descending carriers, both said roller trains comprising rollers so mounted therein and at such distance from one another that said prongs of said carriers of said first group can pass through the gaps between adjacent rollers of said roller trains.

5. The apparatus of claim 1, 2, 3 or 4, wherein said transversely conveying means comprises a second chain composed of links and joints and orbiting in a plane, the carrier bar of said transversely conveyed carrier comprises a carrier shaft being pivotally mounted on one of said links of said second chain, and having a free shaft end on which that carrier bar of said transversely conveyed carrier is fixedly mounted to extend outside and parallel with the plane in which said second chain orbits, and wherein said parallelogram-guiding means hingedly engage said carrier shaft.

* * * * *